United States Patent
Kim et al.

(10) Patent No.: US 7,550,796 B2
(45) Date of Patent: Jun. 23, 2009

(54) GERMANIUM SEMICONDUCTOR DEVICE AND METHOD OF MANUFACTURING THE SAME

(75) Inventors: Sang Hun Kim, Daejeon (KR); Hyun Cheol Bae, Daejeon (KR); Sang Heung Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 71 days.

(21) Appl. No.: 11/947,123

(22) Filed: Nov. 29, 2007

(65) Prior Publication Data

US 2008/0135878 A1 Jun. 12, 2008

(30) Foreign Application Priority Data

Dec. 6, 2006 (KR) ................ 10-2006-0123137
Feb. 28, 2007 (KR) ................ 10-2007-0020057

(51) Int. Cl.
*H01L 29/78* (2006.01)
*H01L 21/336* (2006.01)

(52) U.S. Cl. ............... 257/288; 257/296; 257/E29.082; 257/E29.15; 257/E29.255; 257/E29.297; 438/197; 438/296

(58) Field of Classification Search ........... 257/288, 257/327, 347, 384, 410, E29.082, E29.15, 257/E29.255, E29.297; 438/197, 287, 294, 438/296, 300, 301
See application file for complete search history.

(56) References Cited

U.S. PATENT DOCUMENTS

2004/0061191 A1 4/2004 Paton et al.

FOREIGN PATENT DOCUMENTS

JP 09-186319 7/1997

(Continued)

*Primary Examiner*—Evan Pert
(74) *Attorney, Agent, or Firm*—Rabin & Berdo, PC (57) ABSTRACT

A germanium semiconductor device and a method of manufacturing the same are provided. The method includes the steps of: forming an isolation layer on a substrate using a shallow trench; forming a silicon-nitride layer on the substrate, and selectively etching the silicon nitride layer to expose source and drain regions; injecting impurities onto a surface of the substrate over the exposed source and drain regions using delta-doping to form a delta-doping layer; selectively growing a silicon germanium layer containing impurities on the delta-doping layer; rapidly annealing the substrate and forming source and drain regions by diffusion of the impurities; depositing an insulating layer on the entire surface of the substrate; etching the insulating layer and forming source and drain contact parts to be in contact with source and drain terminals; depositing metal over the insulating layer having the source and drain contact parts thereon and forming a metal silicide layer; and after forming the silicide layer, forming the source and drain terminals to be in contact with the silicide layer. Accordingly, the source and drain regions having a shallow junction depth may be ensured by forming the source and drain regions through annealing after delta-doping and selectively growing the silicon germanium layer containing high-concentration impurities. Also, the germanium silicide layer is stably formed by the silicon germanium layer grown in the source and drain regions, and thus contact resistance is lowered and driving current of the device is improved.

18 Claims, 5 Drawing Sheets

FOREIGN PATENT DOCUMENTS

| | | |
|---|---|---|
| KR | 100237180 B1 | 10/1999 |
| KR | 1020020001202 A | 1/2002 |
| KR | 1020020001355 A | 1/2002 |
| KR | 2006-0103462 | 9/2006 |
| WO | 2004/100239 | 11/2004 |
| WO | 2005/017964 | 2/2005 |
| WO | 2005/067055 | 7/2005 |

GERMANIUM SEMICONDUCTOR DEVICE AND METHOD OF MANUFACTURING THE SAME

CROSS-REFERENCE TO RELATED APPLICATION

This application claims priority to and the benefit of Korean Patent Application Nos. 2006-123137, filed on Dec. 6, 2006 and 2007-20057 filed on Feb. 28, 2007, the disclosures of which are incorporated herein by reference in their entirety.

BACKGROUND

1. Field of the Present Invention

The present invention relates to a germanium semiconductor device and a method of manufacturing the same, and more particularly, to a germanium semiconductor device comprising source and drain regions in a germanium substrate formed by delta-doping, in-situ selective deposition of a silicon-germanium (SiGe) layer containing impurities and diffusion through annealing, and a method of manufacturing the same.

2. Discussion of Related Art

With the trend to various compact, thin and lightweight electrical devices, the scaling-down of a semiconductor device has recently been accelerated. As a CMOS transistor is reduced in size, the device increases in operating speed and integration density. However, when the CMOS transistor is formed to have a gate width of 65 nm or less, it faces many difficulties in process as well as improvement of drive current due to a short channel effect, etc.

To solve these difficulties, methods for modifying a structure of a conventional silicon (Si) MOS transistor and improving electron and hole mobility by applying tensile and compressive strains to a channel are provided. The application of strains to the silicon channel has a difficulty in growing a SiGe layer, that has a larger lattice structure than a Si layer under the channel, while reducing strains without any defect. However, the growth of a SiGe buffer layer requires high technology, which results in poor economical efficiency and reproducibility.

Accordingly, to utilize germanium (Ge) having a 2.5 times faster electron mobility and a 5 times faster hole mobility than those of silicon, recent research on a Ge MOS transistor using a Ge substrate has actively been progressing.

However, the Ge MOS transistor is not easily manufactured because a Ge oxide layer which will be applied to a gate insulating layer and an isolation layer is not stable, and source and drain regions are not easily manufactured by an ion injection method due to low solubility of a Ge single crystal to impurities and fast diffusion rate. In addition, the manufacture of the Ge MOS transistor may result in a decrease in device characteristics because of very high contact resistance between a metal connection and a Ge layer.

Also, much research on a high-k metal oxide layer (a high-k dielectric layer) for application to nano-sized devices has been progressing recently, and some of these devices already have performance suitable for commercialization. Such a high-k dielectric layer can be applied to the Ge MOS transistor as a gate insulating layer, but it still has problems of formation of source and drain regions having a shallow junction depth with high-concentration impurities and high contact resistance between a metal connection and a Ge layer.

SUMMARY OF THE PRESENT INVENTION

The present invention provides a germanium (Ge) semiconductor device which performs delta-doping over source and drain regions, selectively grows a silicon-germanium (SiGe) layer including high-concentration impurities, and then forms a nickel-germanium (NiGe) silicide layer by rapid thermal annealing (RTA), thereby reducing a contact resistance between source and drain terminals to improve a driving current characteristic of a device, and a method of manufacturing the same.

In one aspect, a method of manufacturing a Ge semiconductor device includes the steps of: forming an isolation layer on a substrate using a shallow trench; forming a silicon-nitride layer on the substrate, and selectively etching the silicon nitride layer to expose source and drain regions; injecting impurities onto a surface of the substrate over the exposed source and drain regions using delta-doping to form a delta-doping layer; selectively growing a silicon germanium layer containing impurities on the delta-doping layer; rapidly annealing the substrate and forming source and drain regions by diffusion of the impurities; depositing an insulating layer on the entire surface of the substrate; etching the insulating layer and forming source and drain contact parts to be in contact with source and drain terminals; depositing metal over the insulating layer having the source and drain contact parts thereon and forming a metal silicide layer; and after forming the silicide layer, forming the source and drain terminals to be in contact with the silicide layer.

The method may further include the steps of: before forming the source and drain contact parts, forming a metal gate on the insulating layer, and forming an insulating passivation layer on the insulating layer having the metal gate thereon; etching the insulating passivation layer and forming a gate contact part to expose the metal gate; and forming a gate terminal electrically connected to the metal gate through the gate contact part.

The source and drain contact parts may be formed by etching the insulating layer and the insulating passivation layer. The gate terminal may be formed together with the source and drain terminals. Before forming the delta-doping layer and growing the silicon germanium layer, the substrate may be cleaned. The cleaning step may use a diluted fluoric acid solution.

Before forming the delta-doping layer, the substrate may be further annealed in a chemical vapor deposition apparatus in a high-temperature $H_2$ gas atmosphere. The delta-doping layer may be formed using $B_2H_6$ and $PH_3$ by injecting the impurities onto the surface of the source and drain regions for 1 to 5 minutes.

The deposition of the silicon germanium layer may be performed using a mixture gas of $SiH_2Cl_2/GeH_4/HCl/H_2$ or $SiH_4/GeH_4/HCl/H_2$ by a chemical vapor deposition method at a temperature of 550 to 700□. During the deposition of the silicon germanium layer, germanium content in the silicon germanium layer is in a range from 40 to 80%. Deposition of the silicon germanium layer may be performed by in-situ injecting high-concentration impurities into the silicon-germanium layer. Source and drain regions may be formed by high-temperature RTA at a temperature of 800 to 900□ within a minute.

Formation of a silicide layer may include the steps of: depositing nickel on the entire surface of the substrate; and forming a nickel-germanium silicide layer on the silicon-germanium layer exposed through the source and drain contact parts by annealing. The annealing process may be performed in a range from 500 to 600° C. The substrate may be a germanium substrate, and the insulating layer may be a high-k metal oxide layer.

According to another aspect of the present invention, a germanium semiconductor device is manufactured by the method explained above.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will now be described more fully hereinafter with reference to the accompanying drawings, in which exemplary embodiments of the present invention are shown.

Figure 1:
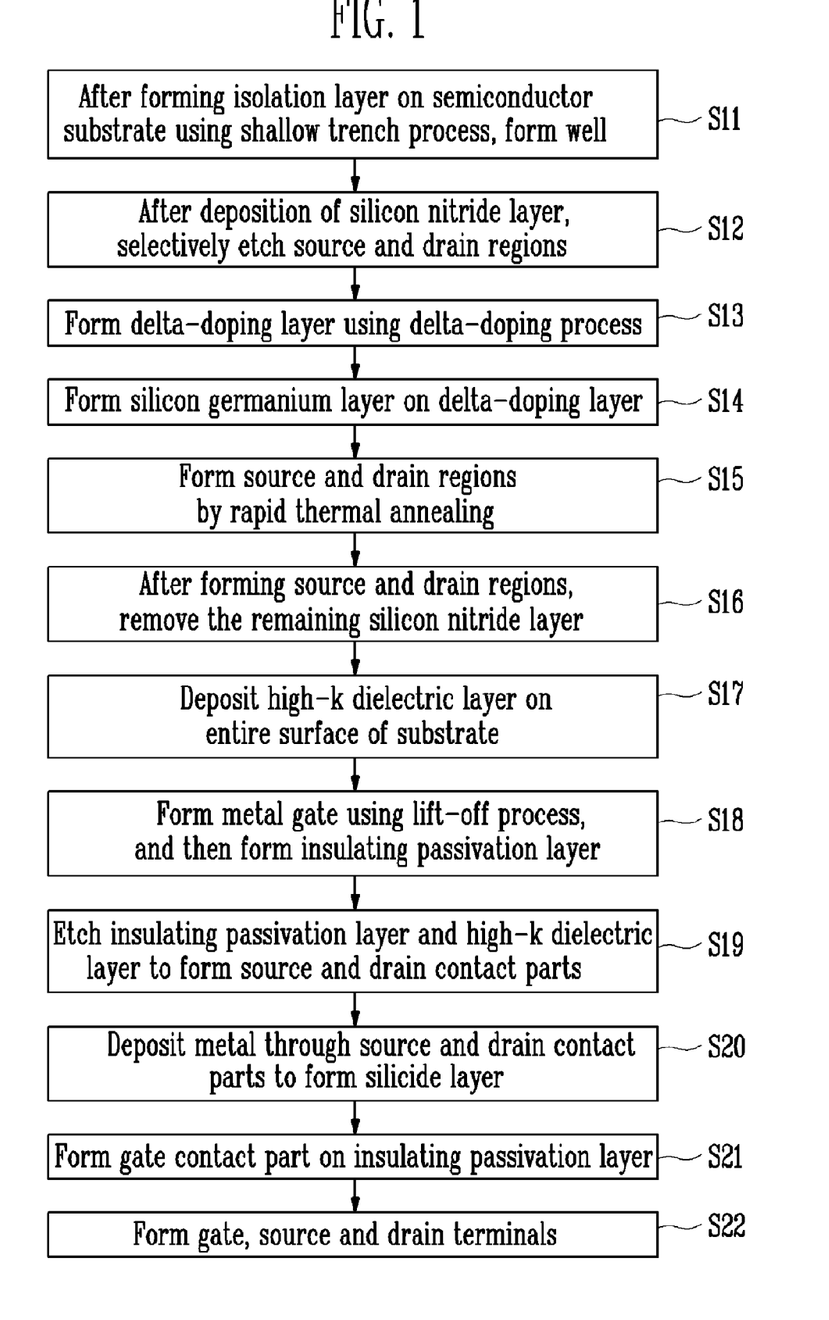
FIG. 1 is a flowchart illustrating a method of manufacturing a germanium (Ge) semiconductor device according to an exemplary embodiment of the present invention.

FIG. 1 is a flowchart illustrating a method of manufacturing a germanium (Ge) semiconductor device according to an exemplary embodiment of the present invention, and FIGS. 2A to 2H are cross-sectional views illustrating a method of manufacturing a Ge semiconductor device having source and drain regions according to an exemplary embodiment of the present invention.

Figure 2A:
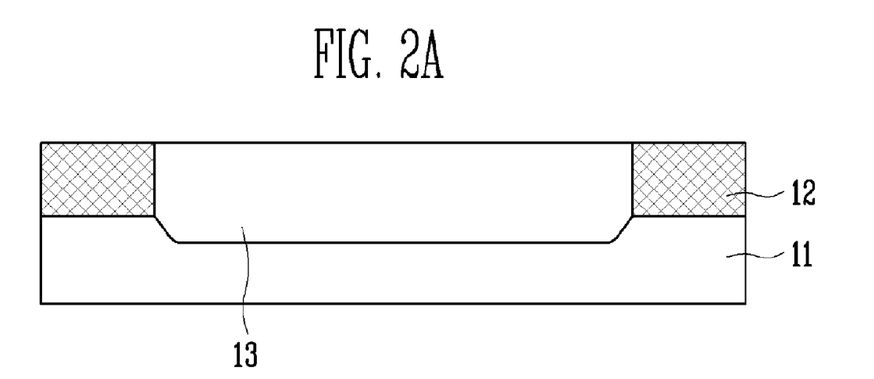
FIGS. 2A to 2H are cross-sectional views illustrating a method of manufacturing a Ge semiconductor device having source and drain regions according to an exemplary embodiment of the present invention.

To manufacture the Ge semiconductor device according to the present invention, referring to FIGS. 1 (S11) and 2A, an isolation layer 12 is formed on a semiconductor substrate 11 using a shallow trench process, and then a well 13 is formed thereon by ion injection. Here, the semiconductor substrate 11 may be a single crystal Ge substrate or a high-quality Ge on insulator (GOI) substrate based on a silicon substrate.

Figure 2B:
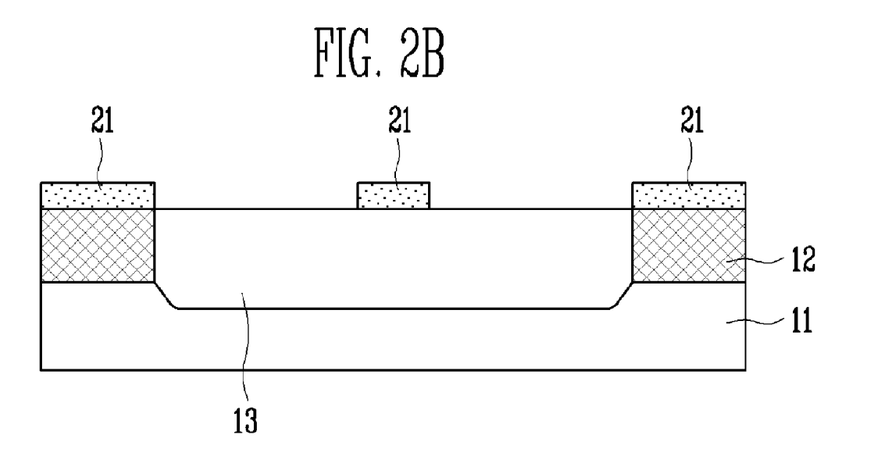

Referring to FIGS. 1 (S12) and 2B, a silicon-nitride (SiN) layer 21 is formed on the semiconductor substrate 11. After forming the SiN layer 21, the SiN layer 21 in regions to be formed as a source and a drain is etched using a photoresist pattern. Here, the etching of the SiN layer 21 is performed at the ratio of dry etching to wet etching of 9:1. After the dry etching process is performed on the entire surface of the SiN layer 21 at 9 of the total ratio of the etching process, the wet etching process is performed at 1 of the total ratio of the etching process. The reason for performing the dual etching process as described above is to prevent occurrence of dislocation on the SiGe layer due to a surface defect of the semiconductor substrate 11 during the subsequent selective deposition of the SiGe layer.

Although not illustrated in the drawing, since quality (surface roughness, etc.) of the SiGe layer may be affected by the underlying layer, the semiconductor substrate 11 is cleaned with a diluted fluoric acid solution prior to the formation of the SiGe layer, and then a natural oxide layer (not illustrated) formed on the surface of the semiconductor substrate 11 is completely removed by performing annealing in a chemical vapor deposition (CVD) apparatus in a high-temperature $H_2$ gas atmosphere.

Figure 2C:
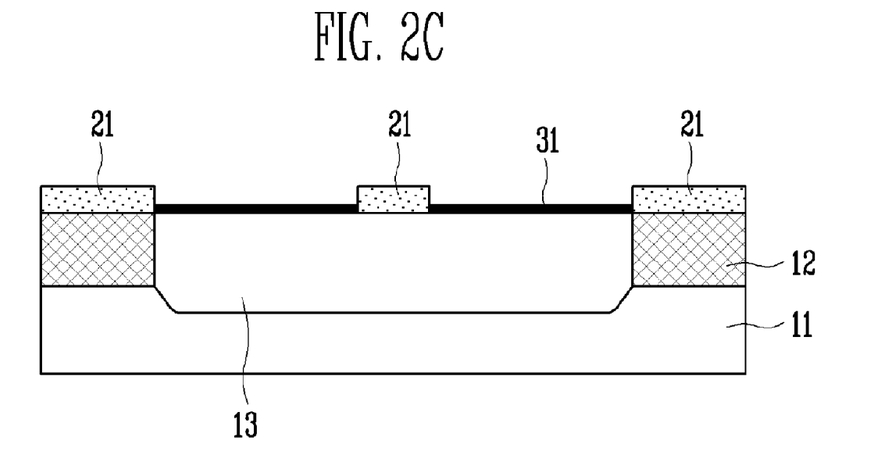

Next, referring to FIGS. 1 (S13) and 2C, a delta-doping layer 31 is formed on the semiconductor substrate 11 having the etched SiN layer 21 using a delta-doping process. The delta-doping layer 31 is a dopant gas layer, which is delta-doped using phosphorous (P) in manufacturing an NMOS device, and boron (B) in manufacturing a PMOS device. The delta-doping layer 31 is formed to increase concentrations in source and drain regions which will be formed in the subsequent process. The delta-doping process uses diborane ($B_2H_6$) as a boron gas, and phosphine ($PH_3$) as a phosphorous gas, and is performed for 1 to 5 minutes. Critical factors affecting the concentration of the impurity during the delta-doping process include doping time, desorption time and a flow of impurities. Experiments show that the desorption time is little changed, which refers to the interval from the stoppage of supply of a source gas of Si or Ge related to its growth to the beginning of the delta-doping of an impurity, or the time taken until re-injection of the source gas after delta-doping. However, the concentrations of the impurity are somewhat changed depending on the doping time, which may be seen by a graph illustrating concentration distributions in the SiGe layer according to the delta-doping time of boron during the SiGe growth of FIG. 3.

Figure 2D:
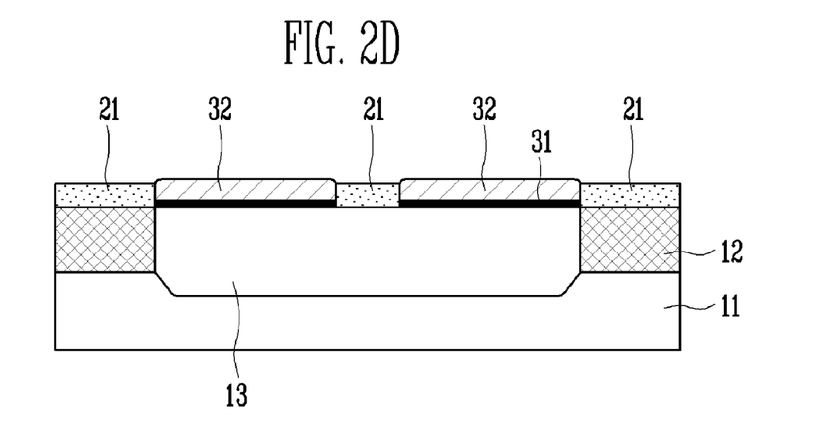

After the delta-doping process, referring to FIGS. 1 (S14) and 2D, the SiN layer 21 is etched to form a SiGe layer 32 on the delta-doping layer 31, i.e., over the exposed source and drain regions. Here, the SiGe layer 32 is sequentially formed on the delta-doping layer 31 using a chemical vapor deposition (CVD) process. The CVD process for forming the SiGe layer 32 uses $SiH_2Cl_2$ or $SiH_4$ as a silicon source gas, and $GeH_4$ as a Ge source gas, and may use a mixture gas thereof using HCl gas to increase an etch selectivity with respect to the SiN layer 21 during deposition. For example, the CVD process uses a mixture gas of $SiH_2Cl_2/GeH_4/HCl/H_2$ or $SiH_4/GeH_4/HCl/H_2$, wherein $H_2$ is a reduction gas. The SiGe layer 32 grown in the source and drain regions may project outward more than the exposed region from the SiN layer. Here, to stop lateral diffusion of the impurities injected in-situ, the CVD process may be performed at a temperature of 700° C. or less. Thus, the CVD process of the selective SiGe layer 32 is performed in a range from 550 to 700° C. During deposition of the selective SiGe layer 32, Ge content is changed by controlling a ratio of $SiH_4/GeH_4$, and controlled within 40% to 80% in consideration of a critical thickness to the Ge substrate. Also, during deposition of the selective SiGe layer 32, high-concentration P is injected in-situ in a case of the NMOS device, and high-concentration B is injected in-situ in a case of the PMOS device.

Figure 2E:
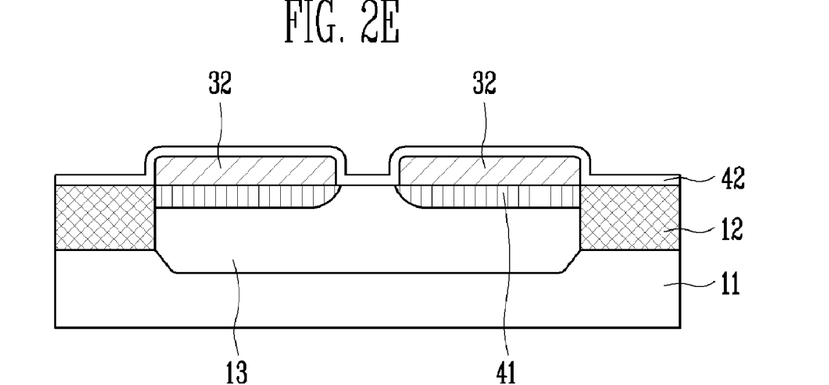

After deposition of the SiGe layer 32, referring to FIGS. 1 (S15) and 2E, the SiGe layer 32 and the delta-doping layer 31 are rapidly annealed at a high temperature to form source and drain regions 41. The SiN layer 21 disposed over a channel serves to prevent diffusion of the impurities into the channel region from the high-concentration SiGe layer 32 and the delta-doping layer 31 during the high-temperature annealing process. The annealing process may be performed within 1 minute at a temperature of 800 to 900° C. After annealing, the SiN layer 21 formed on the semiconductor substrate 11 is completely removed using a wet-etching process (S16).

In the subsequent step (S17), a high-k dielectric layer 42 is deposited on the entire surface of the semiconductor substrate 11 having the SiGe layer 32. Here, the high-k dielectric layer 42 includes a metal oxide layer. Although not disclosed in this embodiment, prior to the deposition of the high-k dielectric layer 42, a germanium-oxynitride (GeON) layer (not illustrated) may be further formed between the high-k dielectric layer 42 and the SiGe layer 32 as an intermediate layer to prevent leakage current between the high-k dielectric layer 42 and the SiGe layer 32 and to improve layer quality.

Figure 2F:
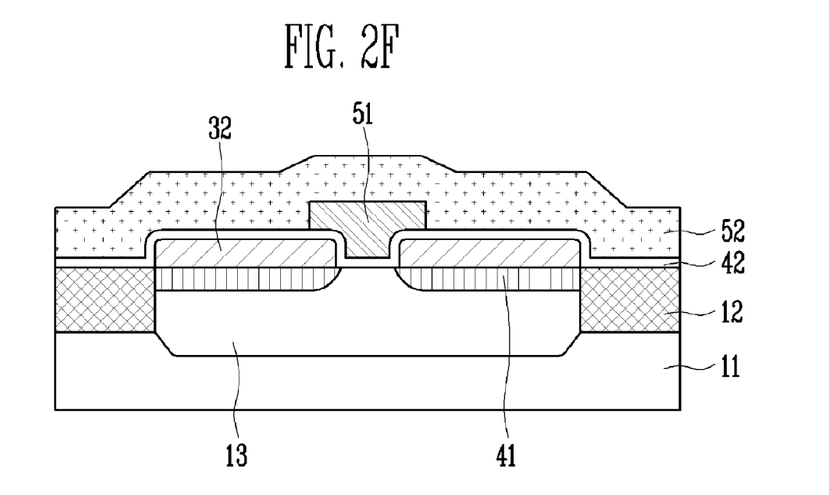

Referring to FIG. 1 (S18) and 2F, a metal gate 51 is formed at a position in which the SiN layer between the SiGe layers 32 is etched. The metal gate 51 is formed by a lift-off process, and an insulating passivation layer 52 is formed over the metal gate 51.

Figure 2G:
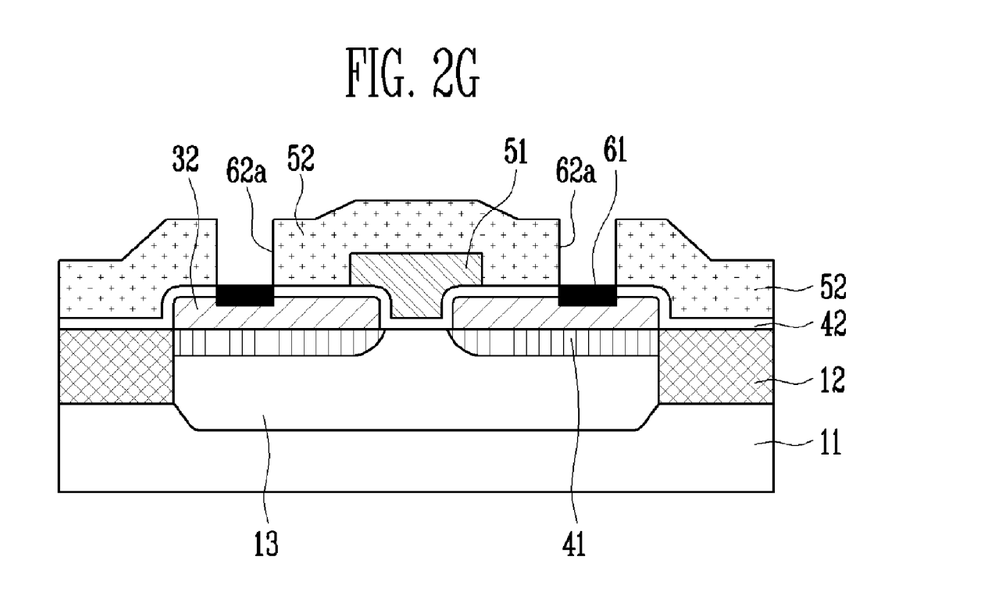

Referring to FIGS. 1 (S19 and S20) and 2G, the insulating passivation layer 52 and the high-k dielectric layer 42 are etched using a photoresist pattern so as to form source and drain contact parts 62a in which source and drain terminals will be formed, respectively. Through the contact parts 62a formed by etching the insulating passivation layer 52 and the high-k dielectric layer 42, the SiGe layer 32 is exposed. After the formation of the contact parts 62a, metal to be formed as silicide by reaction with the SiGe layer 32 is deposited on the insulating passivation layer 52 having the contact parts 62a. In this embodiment, after depositing Ni, the resulting layer is annealed at a temperature of 500 to 600□, which results in a NiGe silicide layer 61 formed on the exposed SiGe layer 32.

In general, it is possible to form germanide by direct junction between metal and Ge, but this results in very high sheet resistance due to segregation of Ge during annealing. Thus, in the present invention, the source and drain regions are selectively grown in the SiGe layer, thereby forming the source and drain regions by diffusion, in addition to easily forming metal-Ge silicide to reduce a contact resistance with the source and drain terminals.

To form the metal-Ge silicide layer, various metals (Ti, Co, Ni, etc.) may be used, for example, in which Ti causes formation of a core by Si—Ge extraction along a grain boundary by combining excess germanium with silicon, and Co exhibits increased sheet resistance by diffusion of the excess germanium into the grain boundary to form a germanium concentrated cluster. In contrast, according to the results of the research, a Ni—Ge silicide layer formed using Ni exhibits stabilized phase separation, and similar sheet resistance to that of the Ni silicide layer. Accordingly, the present invention is limited to a method of selectively growing the SiGe layer on the Ge substrate in the source and drain regions to form the Ni—Ge silicide layer by application of the Ge silicide layer formed of Ni.

Figure 2H:
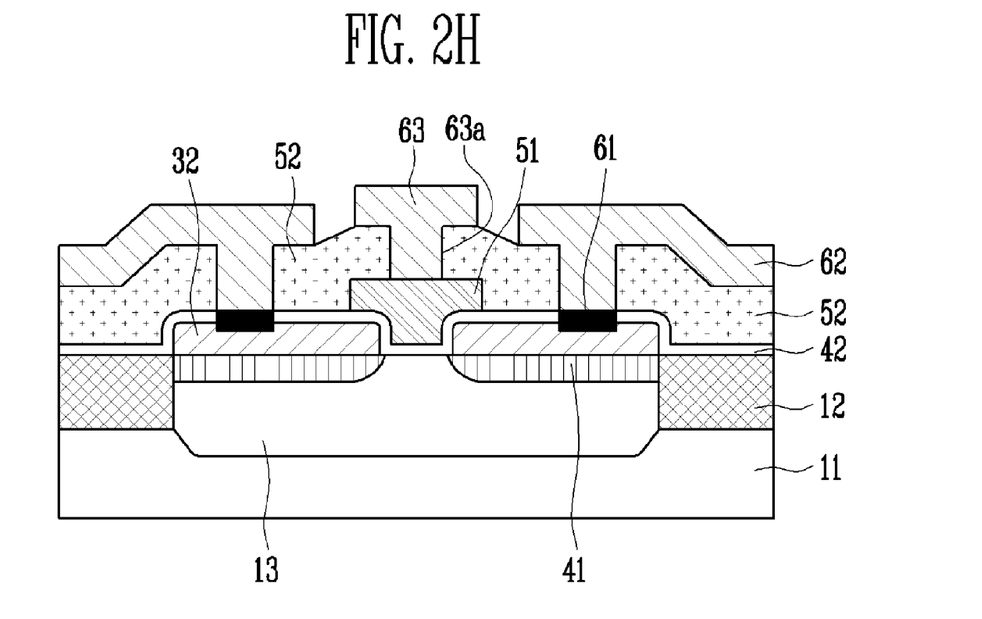

Referring to FIGS. 1 (S21 and S22) and 2H, gate contact parts 63a are formed on the insulating passivation layer 52 using photolithography and etching processes. After the formation of the gate contact part 63a, a gate terminal 63, and source and drain terminals 62 are formed in the gate contact part 63a, and the source and drain contact parts 62a, respectively, using a typical metallization process.

Figure 3:
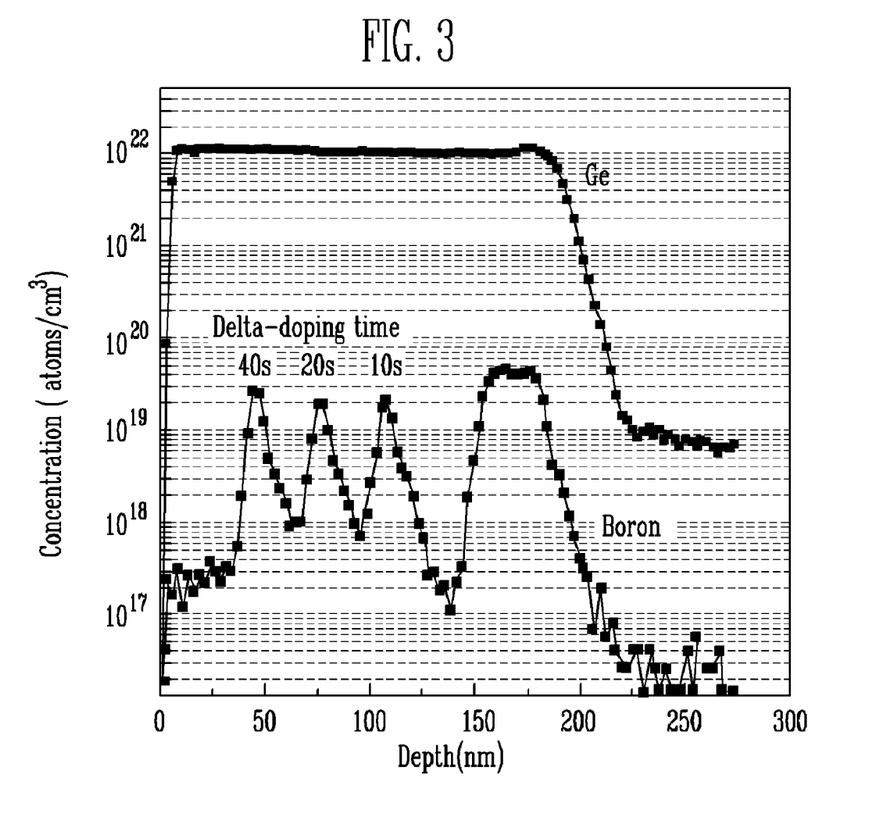
FIG. 3 is a graph illustrating concentration distribution in a silicon-germanium (SiGe) layer depending on delta-doping time of boron (B) during growth of the SiGe layer according to the present invention.

FIG. 3 is a graph illustrating concentration distribution in a SiGe layer depending on delta-doping time of boron (B) during growth of the SiGe layer according to the present invention. In particular, FIG. 3 is a graph illustrating the concentration distribution in the SiGe layer according to delta-doping time of boron during the process of FIG. 1 (S13), in which a horizontal axis represents depth, and a vertical axis represents concentration. Referring to FIG. 3, when $B_2H_6$ is injected in-situ during the growth of the SiGe layer having a Ge concentration of 20%, the concentration of boron in the SiGe layer 32 is constantly detected at $4e19/cm^3$.

Three peaks on the left side indicate concentration distributions of boron after the delta-doping process is performed for 40, 20, and 10 seconds, respectively. Here, the concentrations of boron are $2e19/cm^3$ at 10 and 20 seconds, and $3e19/cm^3$ at 40 seconds. As the delta-doping time increases, the concentration of the impurity increases, which results in almost 50% or more concentration distribution and very sharp graph, even though the maximum value is not larger than that of the in-situ injection. Accordingly, when the source and drain regions 41 are formed by annealing the high-concentration SiGe layer 32 obtained after delta-doping, source and drain regions having higher concentrations of impurities than those obtained without delta-doping may be obtained.

Figure 4:
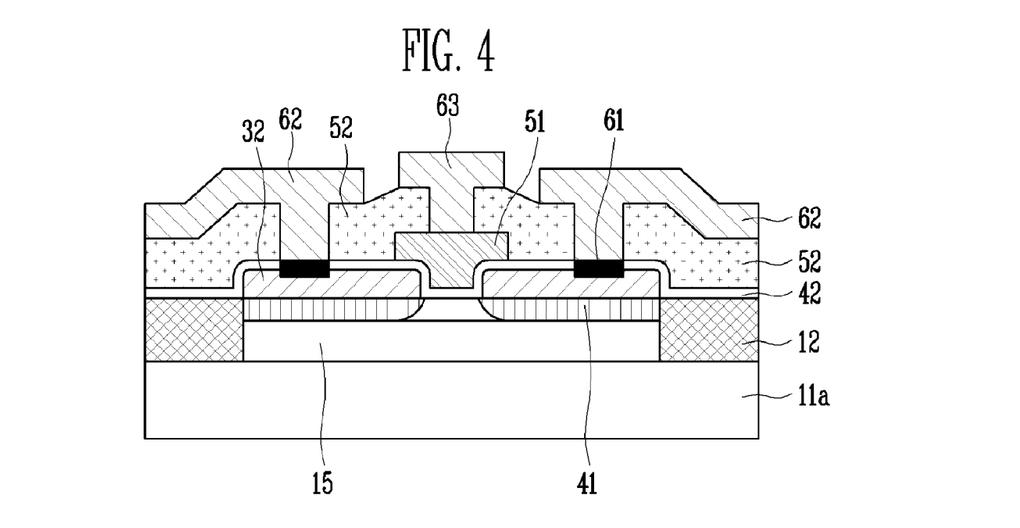
FIG. 4 is a cross-sectional view of a Ge semiconductor device applied to a germanium on insulator (GOI) substrate according to another exemplary embodiment of the present invention.

FIG. 4 is a cross-sectional view of a Ge semiconductor device applied to a germanium on insulator (GOI) substrate according to another exemplary embodiment of the present invention. Referring to FIG. 4, the Ge semiconductor device according to another exemplary embodiment of the present invention is different from the Ge semiconductor substrate manufactured by the method illustrated in FIGS. 1 and 2A to 2H only in its substrate, and is equal in components and fabricating method. So, the detailed description of this embodiment refers to the descriptions related to FIGS. 1 and 2A to 2H.

Referring to FIG. 4, a semiconductor substrate used for the Ge semiconductor substrate illustrated in FIG. 4 is a high-quality GOI substrate 11a based on a silicon substrate. GOI 15 is formed on the substrate 11a. In the Ge semiconductor device disclosed in this embodiment, delta-doping is also performed over source and drain regions, the SiGe layer 32 containing high-concentration impurities is selectively grown, and then a Ni—Ge silicide layer 61 is formed by rapid thermal annealing to form gate, source and drain terminals.

In the Ge semiconductor device in FIG. 4, a contact resistance between the source and drain terminals may also be reduced to improve driving current characteristics of the device by performing delta-doping over the source and drain regions, selectively growing the SiGe layer containing high-concentration impurities and forming a NiGe silicide layer through rapid thermal annealing.

As described above, the present invention is capable of forming source and drain regions having a shallow junction depth, and may solve a conventional problem of difficulty in forming source and drain regions because of characteristics of a Ge single crystal layer such as low solubility and fast diffusion rate by delta-doping in the source and drain regions and formation of the source and drain through annealing after a SiGe layer containing high-concentration impurities is grown over the source and drain regions.

Moreover, the SiGe layer grown over the source and drain regions reacts with metal to stably form a NiGe silicide layer, thereby reducing its contact resistance and improving driving current characteristics of a device.

While the present invention has been shown and described with reference to certain exemplary embodiments thereof, it will be understood by those skilled in the art that various changes in form and details may be made therein without departing from the spirit and scope of the present invention as defined by the appended claims.

What is claimed is:

1. A method of manufacturing a germanium semiconductor device, comprising the steps of:

forming an isolation layer on a Ge or GOI substrate using a shallow trench;

forming a silicon-nitride layer on the substrate, and selectively etching the silicon nitride layer to expose source and drain regions;

injecting impurities onto a surface of the substrate over the exposed source and drain regions using delta-doping to form a delta-doping layer;

selectively growing a silicon germanium layer containing impurities on the delta-doping layer;

rapidly annealing the substrate and forming source and drain regions by diffusion of the impurities;

depositing an insulating layer on the entire surface of the substrate;

etching the insulating layer and forming source and drain contact parts to be in contact with source and drain terminals;

depositing metal over the insulating layer having the source and drain contact parts thereon and forming a metal silicide layer; and after forming the silicide layer, forming the source and drain terminals to be in contact with the metal silicide layer.

2. The method according to claim 1, further comprising the steps of:

before forming the source and drain contact parts, forming a metal gate on the insulating layer, and forming an insulating passivation layer on the insulating layer having the metal gate thereon;

etching the insulating passivation layer and forming a gate contact part to expose the metal gate; and forming a gate terminal electrically connected to the metal gate through the gate contact part.

3. The method according to claim 2, wherein the source and drain contact parts are formed by etching the insulating layer and the insulating passivation layer.

4. The method according to claim 2, wherein the gate terminal is formed together while forming the source and drain terminals.

5. The method according to claim 1, further comprising the step of:

before forming the delta-doping layer and growing the silicon germanium layer, cleaning the substrate.

6. The method according to claim 5, wherein the substrate is cleaned using a diluted fluoric acid solution.

7. The method according to claim 1, further comprising the step of:

before forming the delta-doping layer, annealing the substrate in a chemical vapor deposition apparatus in a high-temperature $H_2$ gas atmosphere.

8. The method according to claim 7, wherein the delta-doping layer is formed by injecting the impurities onto the surface of the source and drain regions using $B_2H_6$ and $PH_3$ for 1 to 5 minutes.

9. The method according to claim 1, wherein the silicon germanium layer is deposited using a mixture gas of $SiH_2Cl_2$/$GeH_4$/$HCl$/$H_2$ or $SiH_4$/$GeH_4$/$HCl$/$H_2$ by a chemical vapor deposition method at a temperature of 550 to 700° C.

10. The method according to claim 9, wherein the silicon germanium layer is deposited with a germanium content of 40 to 80% in the silicon germanium layer.

11. The method according to claim 9, wherein the silicon germanium layer is deposited by injecting in-situ high-concentration impurities in the silicon-germanium layer.

12. The method according to claim 1, wherein the source and drain regions are formed by high-temperature rapid thermal annealing at a temperature of 800 to 900° C.

13. The method according to claim 1, wherein the step of forming silicide by depositing the metal comprises the steps of:

depositing nickel on the entire surface of the substrate; and forming a nickel-germanium silicide layer on the silicon-germanium layer exposed through the source and drain contact parts by annealing.

14. The method according to claim 13, wherein the annealing process is performed in a range from 500 to 600° C.

15. The method according to claim 1, wherein the substrate is a germanium substrate or a germanium on insulator (GOI) substrate based on silicon.

16. The method according to claim 1, wherein the insulating layer is a high-k metal oxide layer.

17. The method according to claim 1, wherein the substrate is a germanium substrate or a GOI substrate based on a silicon substrate.

18. A germanium semiconductor device manufactured by the method according to claim 1.

* * * * *